US010132491B2

(12) United States Patent
Wijaya

(10) Patent No.: US 10,132,491 B2
(45) Date of Patent: Nov. 20, 2018

(54) MUSICAL LANTERNS

(71) Applicant: Forever Gifts, Inc., Grand Prairie, TX (US)

(72) Inventor: Hendra Wijaya, Arlington, TX (US)

(73) Assignee: Forever Gifts, Inc., Arlington, TX (US)

( * ) Notice: Subject to any disclaimer, the term of this patent is extended or adjusted under 35 U.S.C. 154(b) by 0 days.

(21) Appl. No.: 14/796,304

(22) Filed: Jul. 10, 2015

(65) Prior Publication Data

US 2018/0106472 A1 Apr. 19, 2018

(51) Int. Cl.

| | |
|---|---|
| ***F21V 33/00*** | (2006.01) |
| ***F21L 4/00*** | (2006.01) |
| ***F21V 23/00*** | (2015.01) |
| ***F21V 23/04*** | (2006.01) |
| ***H04R 5/04*** | (2006.01) |
| ***H04R 3/00*** | (2006.01) |
| ***H04R 1/02*** | (2006.01) |
| *F21W 121/00* | (2006.01) |
| *F21Y 115/10* | (2016.01) |

(52) U.S. Cl.

CPC ........ *F21V 33/0056* (2013.01); *F21V 23/004* (2013.01); *F21V 23/0414* (2013.01); *H04R 1/028* (2013.01); *H04R 3/00* (2013.01); *H04R 5/04* (2013.01); *F21W 2121/004* (2013.01); *F21Y 2115/10* (2016.08); *H04R 2420/07* (2013.01); *H05K 999/99* (2013.01)

(58) Field of Classification Search

CPC ............................... F21V 33/0056; F21L 4/00

USPC ........................................................ 181/141

See application file for complete search history.

(56) References Cited

U.S. PATENT DOCUMENTS

| | | | | |
|---|---|---|---|---|
| D769,843 | S * | 10/2016 | Sadhwani | D14/207 |
| 2009/0034778 | A1* | 2/2009 | Chi | H04R 1/028 381/394 |
| 2011/0012734 | A1* | 1/2011 | Reese | G08B 13/19 340/541 |
| 2014/0321106 | A1* | 10/2014 | Workman | F21L 4/02 362/183 |
| 2015/0300581 | A1* | 10/2015 | Huang | F21L 4/00 362/86 |
| 2016/0198247 | A1* | 7/2016 | Cheney | H04R 1/02 381/334 |
| 2016/0327227 | A1* | 11/2016 | Green, Jr. | F21S 10/043 |
| 2017/0089567 | A1* | 3/2017 | Penrod | F21V 33/0056 |
| 2017/0152997 | A1* | 6/2017 | Plott | F21L 4/00 |

FOREIGN PATENT DOCUMENTS

| | | | |
|---|---|---|---|
| CA | 2849658 A1 * | 10/2015 | F21V 33/0056 |

* cited by examiner

*Primary Examiner* — Jeremy Luks
(74) *Attorney, Agent, or Firm* — Kirby B. Drake; Klemchuk LLP

(57) ABSTRACT

Musical lanterns including a body having one or more light transmissive panels; one or more light emitting elements disposed inside of the body for emitting light through the one or more light transmissive panels; one or more audio speakers disposed about the body for producing an audio sound; and a circuit for controlling the one or more of the one or more speakers and one or more light emitting elements.

20 Claims, 6 Drawing Sheets

MUSICAL LANTERNS

TECHNICAL FIELD OF THE INVENTION

This invention relates, in general, to musical lanterns.

BACKGROUND OF THE INVENTION

Without limiting the scope of the present invention, its background will be described in relation to musical lanterns, as an example.

Lanterns are generally lighting devices used in both indoor and outdoor environments for providing lighting to occupants of the environment. They generally include a structure that supports an internal light source that shines or emits light through one or more transparent or semi-transparent panels. Generally, lanterns provide an aesthetic appearance with functionality of lighting environments without requiring common hard wired lighting devices, such as light bulbs and the like.

There are many known lighting devices that emit light via light sources powered by rechargeable batteries that are charged by photovoltaic panels connected to the lighting devices during when outdoor/indoor light is abundant and the lighting devices are not emitting light. These powered lighting devices may be inserted into the ground in an environment, such as patio area, and they emit low level light through decorative housings for the occupants in low light situations, such as at night.

Oftentimes, it is desirable to have an audio sound to be played in the environment, such as music, but available audio devices may not have speakers and the like for providing a sufficient volume of music to the environment.

SUMMARY OF THE INVENTION

The present invention disclosed herein is directed to musical lanterns. In one embodiment, the present invention is directed to musical lanterns including a body having one or more light transmissive panels; one or more light emitting elements disposed inside of the body for emitting light through the one or more light transmissive panels; one or more audio speakers disposed about the body for producing an audio sound; and a circuit for controlling the one or more of the one or more speakers and one or more light emitting elements.

In one aspect, the musical lantern may further include a controller disposed about the body for accepting input from a user for controlling the one or more of the one or more speakers and one or more light emitting elements. In another aspect, the musical lantern may further include a light transmissive element disposed about the one or more light emitting elements. In yet another aspect, the musical lantern may further include a battery compartment for containing one or more batteries for powering one or more of the one or more speakers and one or more light emitting elements.

Also, the musical lantern may include a lattice work upper portion disposed about the one or more light transmissive panels. Additionally, the musical lantern may include a jack for connecting with an audio source for transmitting an audio signal from the audio source to the musical lantern. Further, the musical lantern may include a wireless connection for connecting with an audio source for transmitting an audio signal wirelessly from the audio source to the musical lantern.

In another embodiment, the present invention is directed to musical lanterns including a lantern frame having an upper portion and a lower portion; a light transmissive panel disposed about at least one of the upper portion and lower portion; a light emitting diode disposed inward of the light transmissive panel for emitting light outward through the light transmissive panel; a light transmissive element disposed about the light emitting element for softening the emitted light from the light emitting diode to produce the effect of a candle; an audio speaker disposed about one of the upper portion and the lower portion for producing an audio sound; a circuit for controlling the one or more of the one or more speakers and one or more light emitting elements; and a controller disposed about the body for controlling the circuit.

In one aspect, the musical lantern may include a lattice work upper portion disposed about at least one of the upper portion and lower portion. In another aspect, the musical lantern may further include a battery compartment for containing one or more batteries for powering the audio speaker and the light emitting diode. Additionally, the musical lantern may include a jack for connecting with an audio source for transmitting an audio signal from the audio source to the musical lantern. Also, the musical lantern may include a wireless module and antenna for connecting with an audio source for transmitting an audio signal wirelessly from the audio source to the musical lantern.

In yet another embodiment, the present invention is directed to musical lanterns including a lantern frame having an upper portion and a lower portion; a light transmissive panel disposed about the upper portion; a light emitting diode disposed inward of the light transmissive panel for emitting light outward through the light transmissive panel; a light transmissive element disposed about the light emitting element for softening the emitted light from the light emitting diode to produce the effect of a candle; an audio speaker disposed about the lower portion for producing an audio sound; a circuit for controlling the one or more of the one or more speakers and one or more light emitting elements; a controller disposed about the body for controlling the circuit; and a battery compartment in electrical communication with the circuit.

In one aspect, the musical lantern may include one or more vertical members disposed about the light transmissive panel. In another aspect, the musical lantern may include one or more horizontal members disposed about the light transmissive panel. In yet another aspect, the musical lantern may include a jack for connecting with an audio source for transmitting an audio signal from the audio source to the musical lantern. Additionally, the musical lantern may include a wireless module and antenna for connecting with an audio source for transmitting an audio signal wirelessly from the audio source to the musical lantern. Also, the musical lantern may include a decorative covering disposed about the audio speaker.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not limit the scope of the present invention.

In the following description of the representative embodiments of the invention, directional terms, such as "above," "below," "upper," "lower," etc., are used for convenience in referring to the accompanying drawings. In general, "above," "upper," "upward," and similar terms refer to a direction toward the top of the musical lantern, and "below," "lower," "downward," and similar terms refer to a direction toward the bottom of the musical lantern. Additionally, the term "proximal" refers to a linear, non-linear, or curvilinear distance or point nearer to a point of reference or direction that is closer to a relative term or object, and the term "distal" refers to a linear, non-linear, or curvilinear distance or point farther to a point of reference or direction that is farther to a relative term or object.

Figure 1:
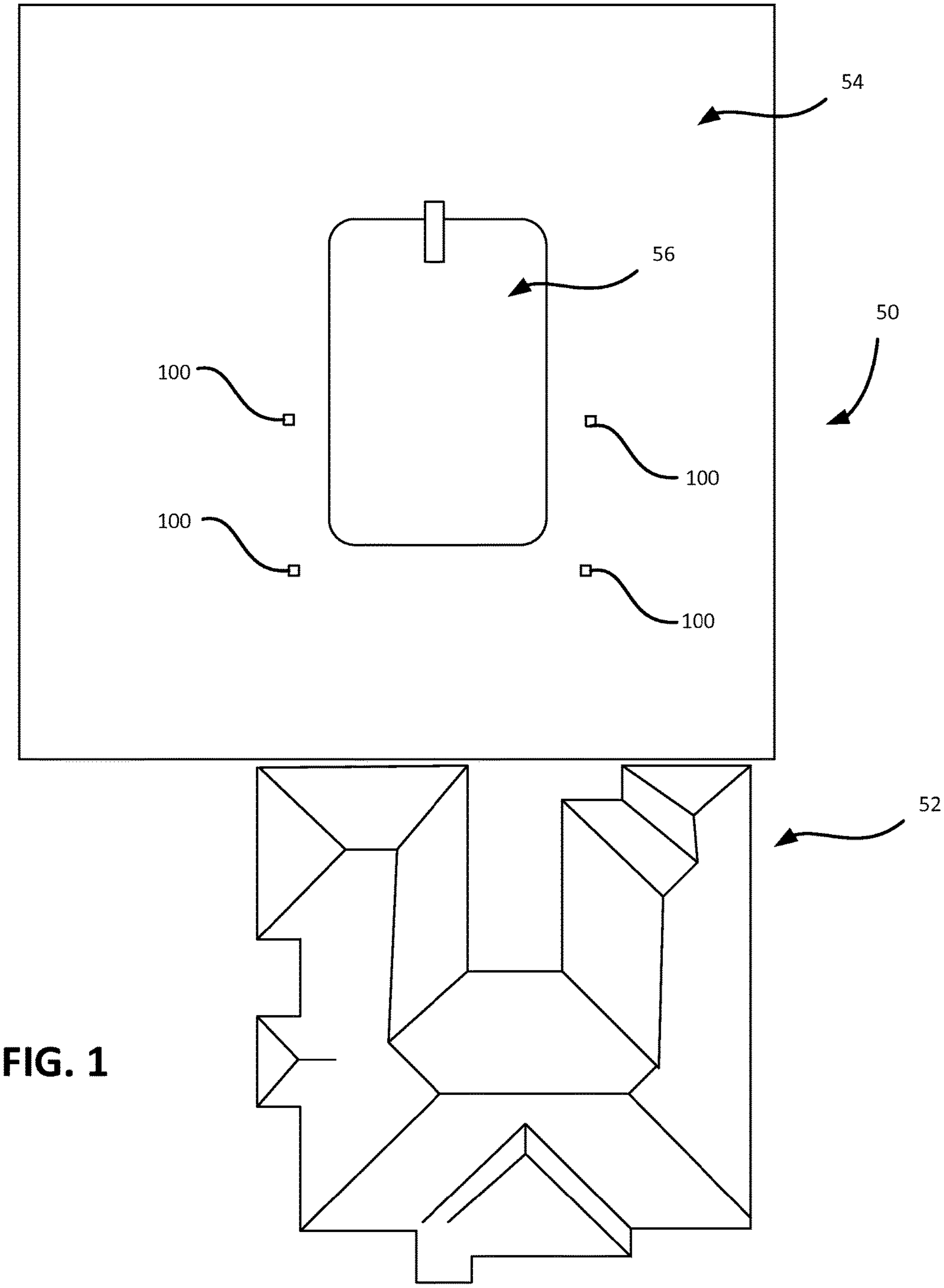
FIG. 1 is a plan view of an environment having a plurality of musical lanterns according to an embodiment.

Referring initially to FIG. 1, an environment that may be used by occupants is schematically illustrated and generally designated environment 50 employing four musical lanterns 100. Although, environment 50 is an outdoor setting and shows use of four musical lanterns 100, one or more musical lanterns 100 may be used anywhere a user wishes to enjoy the ambiance of its lighting and audio features, for example in an indoor room, an outdoor patio, and the like. Additionally, just one musical lantern 100 may be used by a user when wishing to enjoy its features.

Environment 50 may be any type of environment for using one or more of musical lanterns 100. Although musical lantern 100 is discussed herein with reference to environment 50, any number of musical lanterns 100 may be used in any other environment commonly known to those skilled in the art. For example, environment 50 may include a house 52 having a backyard 54 and swimming pool 56. As shown in FIG. 1, four musical lanterns 100 are arranged around the outer perimeter of swimming pool 56 for enjoyment by the occupants of environment 50.

For example, in another embodiment, environment may be a backyard 54 having no swimming pool 56 but landscape features instead. Also, environment 50 may be any combination of these things and including others as well. Musical lantern 100 may be used as a single unit or in combination with other musical lanterns 100 in any environment, indoor and/or outdoor, according to a user's desire.

Figure 2:
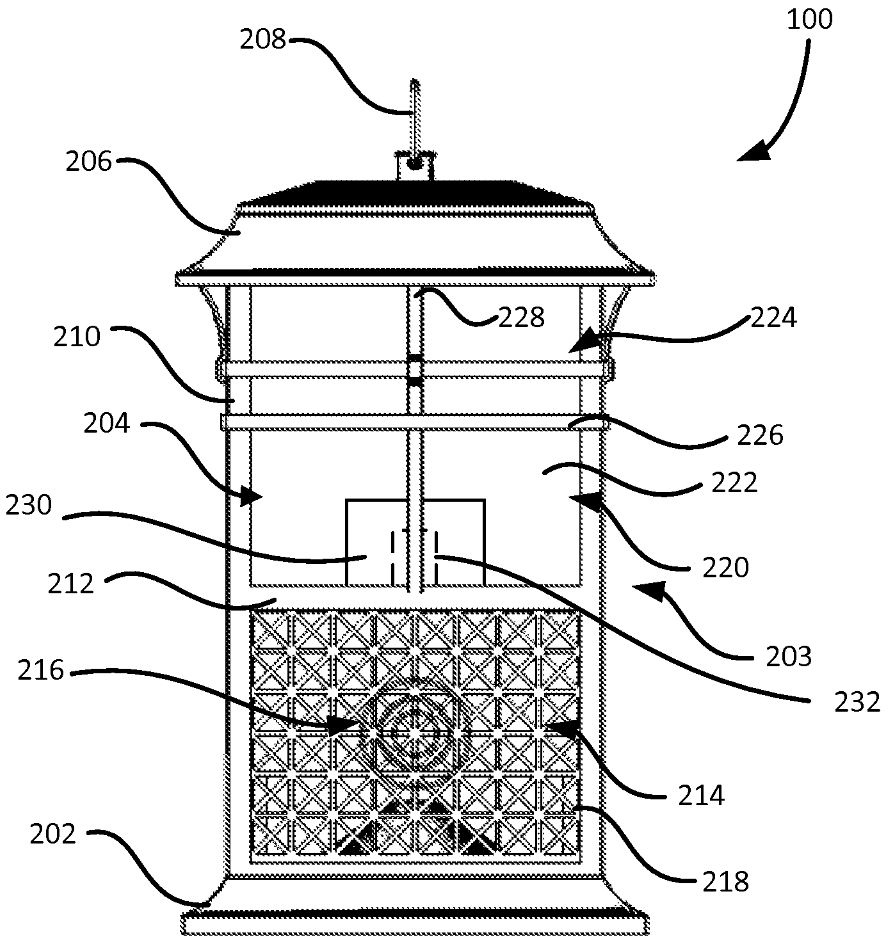
FIG. 2 is a back view of a musical lantern of FIG. 1 according to an embodiment.

Referring to FIG. 2, a musical lantern is schematically illustrated and generally designated 100. Musical lantern 100 may include a base 202 for supporting and providing structural rigidity to musical lantern 100. For example, base 202 may support one or more sides 204 of musical lantern 100, and sides 204 may support a cap or top 206. In one embodiment, base 202, sides 204, and top 206 of musical lantern 100 may form a general body, lantern frame, housing, etc., hereinafter frame 203, of musical lantern 100.

Base 202, sides 204, and/or top 206 may be a single formed structure or may be separate structures that are formed or manufactured individually and then assembled into musical lantern 100. Additionally, any of base 202, sides 204, and/or top 206 may individually be formed of one or more separate structures and then assembled into complete units prior for assembling into musical lantern 100. In one embodiment, musical lantern 100 may not include base 202 and/or top 206 and just include sides 204 where the functionalities described herein are located or disposed within sides 204.

Musical lantern 100 may be any dimensions or heights for any intended purpose. Additionally, base 202, sides 204, and/or top 206 may include other structural or decorative features, such as a hanging loop 208 for hanging musical lantern 100 from a support, such as an arbor, pergola, decking, and the like. Also, frame 203 of musical lantern 100 may be made out of any type of material that provides sufficient structural support and desired aesthetics as known to those skilled in the art. Some exemplary materials may include: metal, cast metal, plastic, etc.

Sides 204 may include vertical structural members 210 that may define and provide structural rigidity to musical lantern 100. Vertical structural members 210 may provide decorative aesthetics to musical lantern 100, instead of structural support, or vertical structural members 210 may provide both. In one aspect, vertical structural members 210 may be in structural communication between base 202 and top 206. In one embodiment, sides 204 may be defined by adjacent vertical structural members 210. In another embodiment, sides 204 may not be defined by one or more vertical structural members 210.

Additionally, musical lantern 100 may include horizontal structural members 212 for providing structural rigidity to musical lantern 100. Horizontal structural members 212 may provide decorative aesthetics to musical lantern 100, instead of structural support, or horizontal structural members 212 may provide both.

In one aspect, horizontal structural members 212 may be in structural communication with the one or more adjacent vertical structural members 210 as shown in FIG. 2. In another aspect, horizontal structural members 212 may be in structural communication with one or more of vertical structural members 210. Musical lantern 100 may include any number of vertical structural members 210 and horizontal structural members 212.

Musical lantern 100 may further include a lower portion 214 that may be defined by the space between one or more of horizontal structural members 212 and base 202 where one or more speakers 216 may be located for emitting audio sound, such as music, to environment 50. Lower portion 214 may be defined as the space between the lower horizontal structural members 212 and the upper end of base 202, for example. In one aspect, lower portion 214 may be located or disposed on each side 204 of musical lantern 100, and in another aspect, lower portion 214 may be located or disposed on fewer than all lower portions 214 of sides 204 of musical lantern 100.

Musical lantern 100 may have a speaker on the front, side, and/or back of the musical lantern 100. It may include one or more speakers. In one embodiment, musical lantern 100 may have a speaker on the front and back of musical lantern 100.

In one embodiment, musical lantern 100 may include decorative covering 218 for providing a decorative covering over the one or more speakers 216. In another embodiment, musical lantern 100 may not include such decorative covering 218. Decorative covering 218 may be any design such that it provides decorative covering over speakers 216 when they are located typically behind or on the inside of decorative covering 218. Decorative covering 218 may include vertical, horizontal, diagonal, free form, and/or curvi-linear designs in a material that is then included within sides 204, in one embodiment. Also, decorative covering 218 may be made of any type of material desirable for providing an aesthetic covering for lower portion 214 of musical lantern 100.

Musical lantern 100 may further include an upper portion 220 that may be defined by the space between one or more of horizontal structural members 212 and top 206 where one or more light transmissive panels 222 may be located for emitting light to environment 50. Upper portion 220 may be defined as the space between any of horizontal structural members 212 and the lower end of top 206, for example. In one aspect, upper portion 220 may be located or disposed on each side or surface of musical lantern 100, and in another aspect, upper portion 220 may be located or disposed on fewer than all lower surfaces and sides of musical lantern 100.

In one embodiment, upper portion 220 of musical lantern 100 may be located in lower portion 214 of musical lantern 100 and vice versa. The arrangement of light transmissive panels 222 may be located on the upper portion 220 or the lower portion 214 as desired. The other components may be relocated accordingly. In one embodiment, speakers 216 may be located in one or more of upper portion 220 and lower portion 214, and decorative covering 218 may be located in the other of them.

Generally, light transmissive panels light transmissive panels 222 may be made of a material that is clear, transparent, semi-transparent, translucent, opaque, or otherwise that allows the light produced by light emitting element 232 to emit outside of the light transmissive panels 222. In one embodiment, the wall thickness of light transmissive panels 222 may be substantially thin so as enable the emission of light therethrough. Some exemplary materials that light transmissive panels 222 may be constructed out of include: plastics, acrylics, glass, etc.

Additionally, musical lantern 100 may include decorative features 224 that may be located or disposed in upper portion 220. Decorative features 224 may be one or more vertical members 228 that may intersect with one or more horizontal members 226 for providing additional decoration in upper portion 220. Generally, vertical members 228 may extend from the lower portion of top 206 to the upper portion of one of horizontal structural members 212. Also, horizontal members 226 may generally extend from one side 204 to an adjacent side 204. Decorative features 224 may be located or disposed about one or more of sides 204 and/or vertical structural members 210 as desired.

Musical lantern 100 may further include one or more light transmissive element 230 that may be designed to resemble a candle or other light emitting element. In one embodiment, light transmissive element 230 may be designed to resemble a candle where it has a generally circular plan or longitudinal cross-section. It may further have an undulating top perimeter to have the impression of a burned candle. Additionally, musical lantern 100 further includes a light emitting element 232 that emits light that is transmitted through light transmissive element 230 for further transmission through light transmissive panels 222.

Additionally, circuit board 700 and/or light emitting element 232 may include flickering algorithm/circuitry/timers for controlling power to light emitting element 232 for providing a burning candle like look or effect. Circuit board 700 may adjust or control the power from batteries 506 to light emitting element 232 such that it appears to flicker like a candle. This may be accomplished by any known means familiar to those skilled in the art. Additionally, musical lantern 100 may include a timer such that it automatically turns on or off at predetermined times.

Light emitting element 232 may be any types of lighting elements, such as fluorescent, incandescent, light emitting diodes (LEDs"), and the like. In one aspect, one or more light emitting elements 232 may be located or disposed within light transmissive element 230 for emitting light through the material making up light transmissive element 230. Light transmissive element 230 may provide a softening or filtering of the light emitted by light emitting element 232 for aesthetic purposes. Additionally, musical lantern 100 may include any number of light transmissive element 230 and/or light emitting element 232 as may be desired.

In one embodiment, light emitting element 232 may be any color including white. It may also be color changing, such that it changes color from yellow/red/blue, for example.

Figure 3:
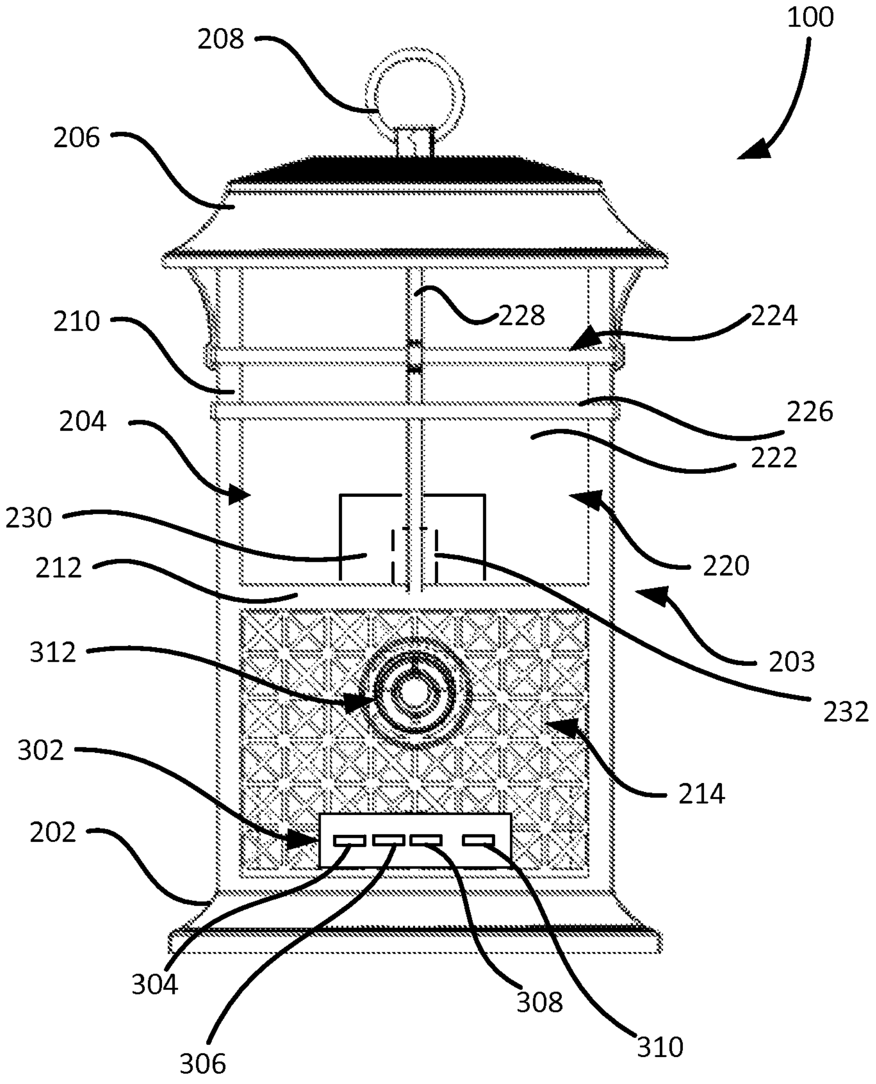
FIG. 3 is a front view of the musical lantern of FIG. 2 according to an embodiment.

Turning now to FIG. 3, another side 204 of musical lantern 100 is shown according to an embodiment of the present musical lantern 100. Musical lantern 100 may include a control panel 302 having an on/off switch 304, up volume switch 306, down volume switch 308, and music input plug 310. In one embodiment, on/off switch 304, up volume switch 306, down volume switch 308, and music input jack or plug 310 are in communication with a controller and/or circuit board 700 (FIG. 7) for controlling the sound output and/or lighting output of musical lantern 100. In another embodiment, any of these switches and/or controllers may be combined into fewer switches having more functionality as is commonly known to those skilled in the art.

Further, musical lantern 100 may include a speaker 312 that may augment or be in addition to speaker 216. As discussed previously, musical lantern 100 may include any number of speakers as may be desired. In one embodiment, musical lantern 100 may just include a speaker 216 that is located on one side sides 204, or it may include multiple speakers, such as speakers 216, 312. Further, as discussed below with reference to FIG. 6, a speaker may also be located in the base 202 of musical lantern 100 by itself or in addition to other speakers.

Control panel 302 may be disposed about any one or more sides 204 of musical lantern 100. Also, on/off switch 304 may control the power from batteries 506 to light emitting element 232 and speakers 216, 312. Down volume switch 308 and music input plug 310 may control the volume output of speakers 216, 312, in one aspect.

In one embodiment, on/off switch 304 may be selected, activated, and the like for controlling power to musical lantern 100. Also, up volume switch 306 and down volume switch 308 may be selected, activated, and the like for controlling the volume of sound and/or music output of musical lantern 100. Additionally, any type of musical device, such as digital music devices (MP4, etc.) may be connected to musical lantern 100 via music input plug 310 for providing an audio (musical, vocal, etc.) signal to musical lantern 100 for outputting through one or more of speakers 216, 312.

Music input plug 310 may be any type of electrical port, jack, etc. for accepting common electrical connector plugs of audio source devices as are commonly known to those skilled in the art. Some exemplary electrical connectors include: Micro-USB, Apple® Lightning, Mini-USB, USB, RCA jacks, stereo plugs, Micro-B plug, non-USB plug, mini-B plug, Standard-A receptacle, Standard-A plug, Standard-B plug, and the like. It may include one or more of these types of jacks as desired. In one embodiment, any of these electrical connectors may charge any of batteries 506.

Figure 4:
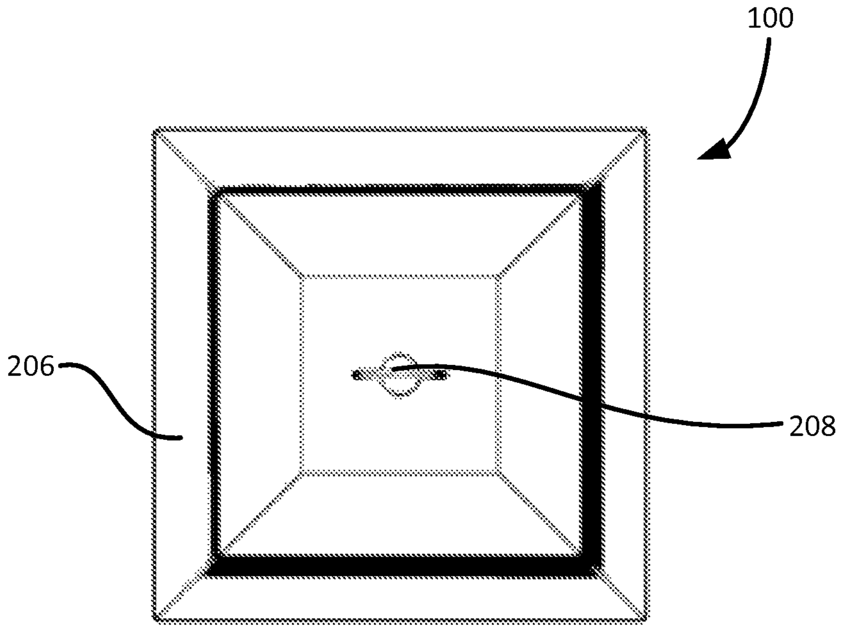
FIG. 4 is a top view of the musical lantern of FIG. 2 according to an embodiment.

Referring now to FIG. 4, a top view of top 206 of musical lantern 100 is shown having a generally square shaped perimeter. In another embodiment, the outer perimeter or shape of musical lantern 100 may be of any symmetrical and/or asymmetrical shape, such as circular, triangular, rectangular, pentagonal, hexagonal, octagonal, oval, free form, and the like. In general, the shape of sides 204 and base 202 may be substantially similar as top 206 or may be different shapes and forms. In one example, musical lantern 100 may have a substantially square outer shape, substantially square-shaped base 202, sides 204, and top 206.

Figure 5:
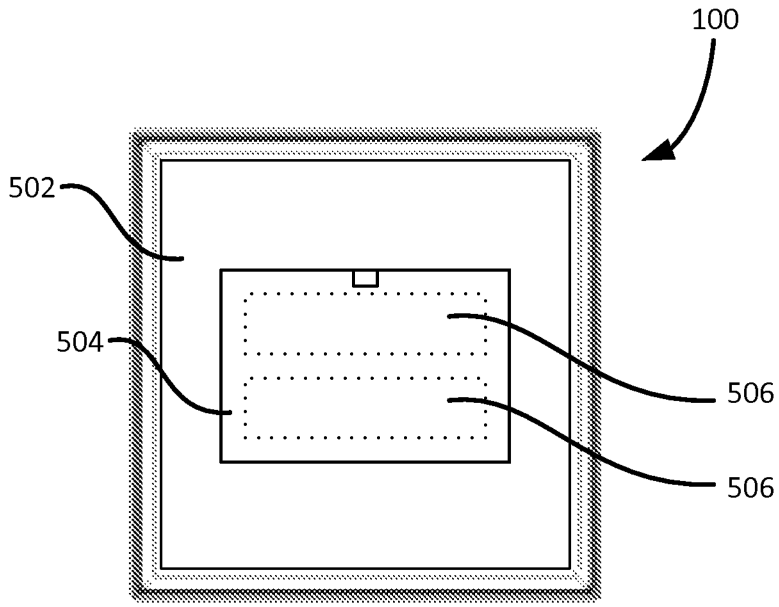
FIG. 5 is a bottom view of the musical lantern of FIG. 2 according to an embodiment.

Turning now to FIG. 5, a bottom view of base 202 of musical lantern 100 is shown also having a substantially square shape or form. In one embodiment, base 202 may include a substantially flat surface 502 for stably supporting musical lantern 100 on surfaces. Base 202 may also include a battery compartment cover 504 that is accessible by a user for inserting and changing out batteries 506 for powering light emitting element 232 and/or speakers 216, 312, 602. Battery compartment cover 504 may be opened and closed to access batteries 506 and protect them during use of musical lantern 100. Battery compartment cover 504 may include slots, latches, and the like (not shown) for enabling a user to open and securely close battery compartment cover 504. In general, the electrical power produced by batteries 506 may be in communication with circuit board 700 to control the power output to light emitting element 232 and/or speakers 216, 312, 602. As discussed above, musical lantern 100 may include any number of speakers 216, 312, speaker 602. In one aspect, batteries 506 may be rechargeable batteries that can be recharged by any of the electrical connections described herein, such as by any of the USB connectors.

Figure 6:
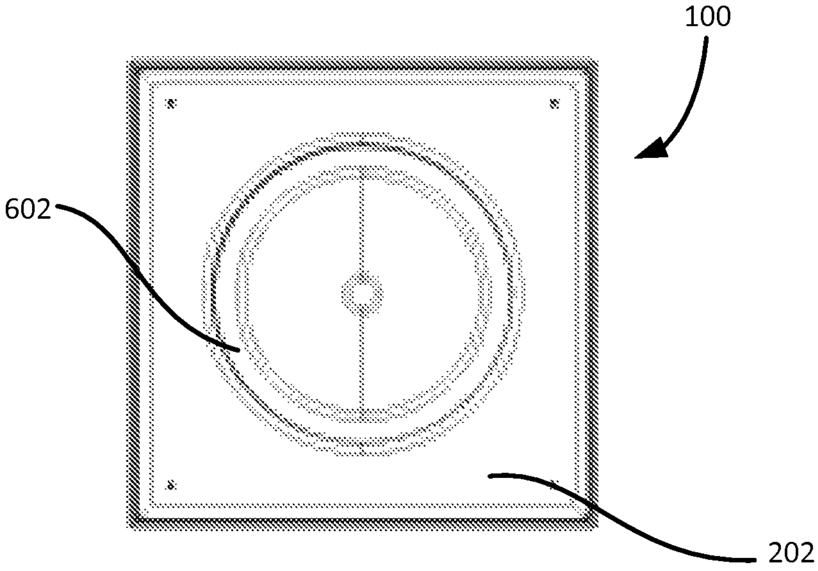
FIG. 6 is a bottom view of the musical lantern of FIG. 2 according to another embodiment.

Referring now to FIG. 6, another embodiment of musical lantern 100 is shown having base 202 that also includes a speaker 602 that may be in addition to one or more of speakers 216, 312. Speaker 602 may be positioned to emit sound out the lower end of base 202. In this embodiment, such sound location may be desirable when musical lantern 100 is hung by hanging loop 208 in a particular location. In one embodiment, musical lantern 100 may include one or more of speakers 216, 312, 602.

Figure 7:
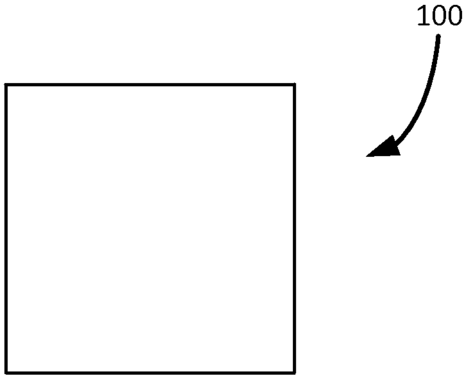
FIG. 7 is a schematic of the electronics of a musical lantern according to an embodiment.

Turning now to FIG. 7, an exemplary circuit board is schematically illustrated and generally designated 700. Circuit board 700 may include basic circuitry for accepting input signals from control panel 302 (FIG. 3), on/off switch 304 (FIG. 3), up volume switch 306, down volume switch 308 (FIG. 3), and music input plug 310 (FIG. 3). Additionally, circuit board 700 may also include basic circuitry for controlling the audio sound output from speakers 216 (FIG. 2), 312 (FIG. 3), speaker 602 (FIG. 6)and/or light emitting element 232 (FIG. 2 and 3).

Figure 8:
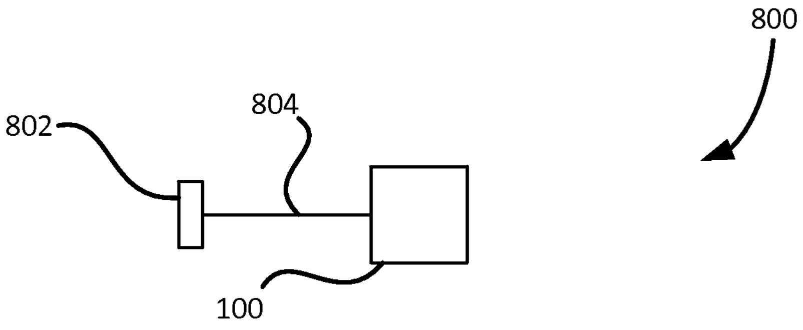
FIG. 8 is a block diagram of an audio source in wired communication with a musical lantern according to an embodiment.

Referring now to FIG. 8, an audio source and musical lantern is schematically illustrated and generally designated 800. In this embodiment, an audio source 802 is in wired communication with musical lantern 100. A cable 804 may be used to connect audio source 802 with musical lantern 100. Music input plug 310 may be used on audio source 802 to connect cable 804 with audio source 802, in one embodiment.

Figure 9:
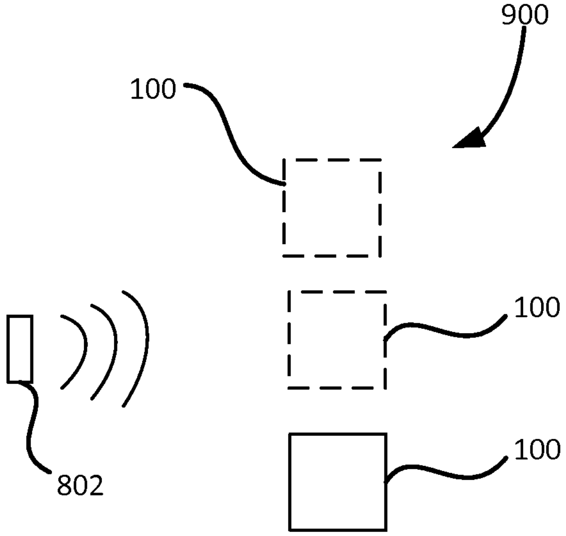
FIG. 9 is a block diagram of an audio source in wireless communication with one or more musical lanterns according to an embodiment.

Additionally and with reference to FIG. 9, an audio source and one or more musical lanterns are schematically illustrated and generally designated 900. In this embodiment, a wireless connection is utilized to transmit the audio signal from an audio source 902 and one or more musical lanterns 100, as shown. Any commonly known wireless protocols or technologies may be utilized, including Bluetooth connectivity. In this embodiment, all of the one or more musical lanterns 100 may be in communication with one or more audio source 902 for receiving the same audio source signal such that all of the musical lanterns 100 are able to play the same audio signal at the same time. One such arrangement may be shown in FIG. 1, where four musical lanterns 100 may be receiving wirelessly the audio signal from audio source 902. Some exemplary wireless technologies, protocols, and the like for transmitting the audio signal to one or more musical lanterns 100 may include any of those known to those skilled in the arts.

In one embodiment, audio sources 802, 902 may transmit audio signals either with a wired connection and/or a wireless connection to one or more musical lanterns 100. Additionally, musical lantern 100 may include wired connectivity functionality, wireless connectivity functionality, or both.

Speakers 216, 312, 602 may be any power wattage, for example five watts to ten watts. They also may be less or more depending on the design of musical lantern 100.

While this invention has been described with reference to illustrative embodiments, this description is not intended to be construed in a limiting sense. Various modifications and combinations of the illustrative embodiments as well as other embodiments of the invention will be apparent to persons skilled in the art upon reference to the description. It is, therefore, intended that the appended claims encompass any such modifications or embodiments.

What is claimed is:

1. A musical lantern, comprising:

a body having one or more light transmissive panels made of a combination of a transparent material and an opaque or frosted material;

one or more light emitting elements disposed inside of the body for emitting light through the one or more light transmissive panels disposed in an upper portion of the musical lantern in a space between horizontal structural members;

one or more audio speakers disposed in a lower portion of the musical lantern in a space between the horizontal structural members and about the body for producing an audio sound; and a circuit for controlling each of the one or more audio speakers and each of the one or more light emitting elements, wherein the one or more audio speakers are arranged to project sound from a top to a base of the musical lantern.

2. The musical lantern as recited in claim 1, further comprising:

a controller disposed about the body for accepting input from a user for controlling the one or more speakers and the one or more light emitting elements.

3. The musical lantern as recited in claim 1, further comprising:

a light transmissive element disposed about the one or more light emitting elements.

4. The musical lantern as recited in claim 1, further comprising:

a battery compartment for containing one or more batteries for powering the one or more speakers and the one or more light emitting elements.

5. The musical lantern as recited in claim 1, further comprising:

a lattice work upper portion disposed about the one or more light transmissive panels.

6. The musical lantern as recited in claim 1, further comprising:

a jack for connecting with an audio source for transmitting an audio signal from the audio source to the musical lantern.

7. The musical lantern as recited in claim 1, further comprising:

a wireless connection for connecting with an audio source for transmitting an audio signal wirelessly from the audio source to the musical lantern.

8. The musical lantern as recited in claim 1 wherein the musical lantern is configured to communicate with additional musical lanterns.

9. The musical lantern as recited in claim 1 wherein the horizontal structural members and vertical structural members provide decorative aesthetics to the musical lantern.

10. A musical lantern, comprising:

a lantern frame having an upper portion and a lower portion;

a light transmissive panel disposed in an upper portion of the musical lantern in a space between horizontal structural members and about at least one of the upper portion and lower portion, wherein the light transmissive panel is made of a combination of a transparent material and an opaque or frosted material;

a light emitting diode disposed inward of the light transmissive panel for emitting light outward through the light transmissive panel;

a light transmissive element disposed about the light emitting element for softening the emitted light from the light emitting diode to produce the effect of a candle;

an audio speaker disposed in a lower portion of the musical lantern in a space between the horizontal structural members and about one of the upper portion and the lower portion for producing an audio sound, wherein the audio speaker is arranged to project sound from the entire height of the musical lantern;

a circuit for controlling the audio speaker and the light emitting diode; and a controller disposed about the body for controlling the circuit.

11. The musical lantern as recited in claim 10, further comprising:

a lattice work upper portion disposed about at least one of the upper portion and lower portion.

12. The musical lantern as recited in claim 10, further comprising:

a battery compartment for containing one or more batteries for powering the audio speaker and the light emitting diode.

13. The musical lantern as recited in claim 10, further comprising:

a jack for connecting with an audio source for transmitting an audio signal from the audio source to the musical lantern.

14. The musical lantern as recited in claim 10, further comprising:

a wireless module and antenna for connecting with an audio source for transmitting an audio signal wirelessly from the audio source to the musical lantern.

15. A musical lantern, comprising:

a lantern frame having an upper portion and a lower portion;

a light transmissive panel disposed about the upper portion and made of a combination of a transparent material and an opaque or frosted material;

a light emitting diode disposed inward of the light transmissive panel for emitting light outward through the light transmissive panel;

a light transmissive element disposed about the light emitting diode for softening the emitted light from the light emitting diode to produce the effect of a candle;

an audio speaker disposed in a lower portion of the musical lantern in a space between horizontal structural members and about the lower portion for producing an audio sound, wherein the audio speaker is arranged to project sound from the entire height of the musical lantern;

a circuit for controlling the audio speaker and the light emitting diode;

a controller disposed about the body for controlling the circuit; and a battery compartment in electrical communication with the circuit.

16. The musical lantern as recited in claim 15, further comprising:

one or more vertical members disposed about the light transmissive panel.

17. The musical lantern as recited in claim 15, wherein the horizontal structural members are disposed about the light transmissive panel.

18. The musical lantern as recited in claim 15, further comprising:

a jack for connecting with an audio source for transmitting an audio signal from the audio source to the musical lantern.

19. The musical lantern as recited in claim 15, further comprising:

a wireless module and antenna for connecting with an audio source for transmitting an audio signal wirelessly from the audio source to the musical lantern.

20. The musical lantern as recited in claim 15, further comprising:

a decorative covering disposed about the audio speaker.

* * * * *